United States Patent [19]

Kianush

[11] Patent Number: 4,760,354

[45] Date of Patent: Jul. 26, 1988

[54] SSB PULSE MODULATOR

[75] Inventor: Kaveh Kianush, Eindhoven, Netherlands

[73] Assignee: U.S. Philips Corporation, New York, N.Y.

[21] Appl. No.: 884,049

[22] Filed: Mar. 26, 1986

[30] Foreign Application Priority Data

Mar. 27, 1985 [GB] United Kingdom ................. 8508016

[51] Int. Cl.$^4$ ............................................. H03C 1/60
[52] U.S. Cl. ................................. 332/9 R; 332/37 R; 332/41; 332/45; 332/48; 375/43; 375/61; 455/47; 455/109
[58] Field of Search ................... 332/9 R, 37 R, 41, 45, 332/48; 455/47, 109; 375/43, 61

[56] References Cited

PUBLICATIONS

Nohara et al, "Generation of Single-Sideband Signal Using Switched-Mode Technique", Bull. Univ. Osaka Prefect A. (Japan), vol. 23, No. 2, 1974, pp. 167–176.

*Primary Examiner*—Siegfried H. Grimm
*Attorney, Agent, or Firm*—Thomas A. Briody; William J. Streeter; Leroy Eason

[57] ABSTRACT

An SSB pulse modulator which attenuates unwanted even harmonics of the carrier frequency without expensive filtering. The modulator comprises two pairs of comparators (12, 14 and 16, 18), and the sine and cosine components of the carrier signal are modulating signal [a(t)] and the Hilbert transform [â(t)] thereof are applied to respective ones of the comparators. EX-OR gates (20, 22) multiply together the outputs of each pair of comparators (12, 14 and (16, 18), the multiplied outputs being combined with each other in a signal combining arrangement (24). Each pair of the comparators produces the unwanted even harmonics, which are then attenuated by subtraction from each other in the combining arrangement.

5 Claims, 3 Drawing Sheets

SSB PULSE MODULATOR

BACKGROUND OF THE INVENTION

1. Field of the Invention

The present invention relates to a method of producing an SSB signal, to an SSB pulse modulator and to a transmitter including the SSB pulse modulator.

2. Description of the Related Art

An edge position modulation technique is disclosed in an article "Modulation Methods Related to Sine-Wave Crossings" by Konrad Piwnicki in IEEE Transactions on Communications, VOL, COM-31, No. 4, April 1983 pages 503 to 508. In this article an equation for the binary signal u(t) which represents the edge position modulated wave is developed where $$u(t) = \frac{2}{\pi} \sum_{n=1}^{\infty} \frac{1}{n} [T_n[r(t)]\sin n \, \omega_c t - T_n[s(t)]\sin n(\omega_c t - \pi/2)] \quad (1)$$

where
r(t) and s(t) are real signals,
$\omega_c$ is the carrier frequency, and
$T_n$ is the Chebyshev polynomial of the first kind of degree n.

FIG. 2 of this article illustrates a simplified scheme for generating the signal u(t) by employing two voltage comparators whose outputs are coupled to respective inputs of an EX-OR gate. The inputs to one of the two comparators are r(t) and cos $\omega_c$t and those to the other of the two comparators are s(t) and sin $\omega_c$t. The EX-OR gate yields a modulated wave with a d.c. component which can be eliminated by a capacitor.

In the above expression (1) when n=1 then $$u(t) = \frac{2}{\pi} [s(t)\cos \omega_c t + r(t)\sin \omega_c t] \quad (2)$$

and this represents a quadrature modulated signal on a carrier of frequency $\omega_c$ with modulating signals s(t) and r(t). When n=2 then $$u(t) = \frac{2}{\pi} [s^2(t) + r^2(t) - 1]\sin 2 \omega_c t \quad (3)$$

and this represents a carrier of frequency $2\omega_c$ amplitude modulated by $s^2(t)+r^2(t)$.

Expression (2) may be regarded as a general form of a narrow-band modulated signal. The type of modulation is determined by the relation between the signals r(t) and s(t). If r(t)=ŝ(t), where ŝ(t) is the Hilbert transform of ŝ(t), the modulated signal will be single sideband with suppressed carrier (SSB-SC) based on the lower sideband. If r(t)=−s(t), the modulated signal will be SSB-SC based on the upper sideband. A disadvantage of producing SSB-SC in this manner is that the output contains a high level of even harmonics of the carrier at low modulation depths. Of these even harmonics the levels of the odd numbered multiples, that is n·2$\omega_c$, where n is an odd integer, are particularly high. Removal of these even harmonics can be achieved by particularly stringent output filtering. However this makes the modulator operation more suited to narrow-band which is unsuitable for a signal, such as speech, having a wide dynamic range.

Another known SSB modulator uses polar inputs as opposed to Cartesian inputs to give a three level harmonic-free output. However the base band signal processing required is very complex.

SUMMARY OF THE INVENTION

An object of the present invention is to overcome the disadvantages of the known modulator circuits.

According to one aspect of the present invention there is provided a method of producing an SSB signal comprising applying first and second quadrature-related components of a carrier signal to first and second pairs of comparators, the first component being applied to one comparator of each pair and the second component being applied to the other comparator of each pair. A modulating signal and the Hilbert transform thereof are respectively applied to a comparator in each pair, and the outputs of the comparators of each pair are multiplied together. The products so obtained are then combined to produce an SSB signal in which strong even harmonics of the carrier signal have been attenuated relative to the levels thereof which would have obtained had only one pair of comparators been employed.

The present invention is based on the realisation that in comparing the quadrature components of a carrier signal and a modulating signal in a pair of comparators, the generation of unwanted strong even harmonics is due to the switching characteristics of the comparators and is not input-dependent. That is, the harmonics exist even in the absence of an input signal. These unwanted even harmonics can be attenuated, without the need for expensive filtering and the requirement for narrowband operation, by duplicating the production of the even harmonics in another pair of comparators and effectively subtracting these even harmonics from the output signal which would otherwise be obtained. In operation, the carrier frequency, odd harmonics and weak even harmonics are input dependent. By attenuating the strong even harmonics by a modulating method in accordance with the present invention, a 10 db drop in the wanted output signal from a maximum value results in approximately a 20 db drop in the unwanted even harmonics and a 20 db drop in the wanted output signal results in an approximately 40 db drop in the unwanted even harmonics. In other words, the reduction in even harmonics is effectively the square of the reduction of the wanted output signal.

According to another aspect of the present invention there is provided an SSB pulse modulator having first and second inputs for respective ones of quadrature-related components of a carrier signal, a third input for a modulating signal, a fourth input for the Hilbert transform of the modulating signal, and first and second pairs of comparators. The first signal input is coupled to an input of the first of the comparators of each pair, the second signal input is coupled to an input of the second comparator of each pair, the third signal input is coupled to a further input of the comparator to which said first signal input is coupled, and the fourth signal input is coupled to a further input of the comparator to which said second input is coupled. A first EXCLUSIVE-OR function circuit is coupled to the outputs of the comparators of the first pair, a second EXCLUSIVE-OR function circuit is coupled to the outputs of the comparators of the second pair, and a signal combining circuit is coupled to the outputs of the EXCLUSIVE-OR function circuits for combining the output signals therefrom in such a sense as to produce in operation an SSB output signal in which strong even harmonics of the carrier signal have been attenuated relative to the levels thereof which would have obtained had only one pair of comparators been employed.

BRIEF DESCRIPTION OF THE DRAWINGS

The present invention will now be described, by way of example, with reference to the accompanying drawings, wherein.

In the drawings corresponding reference numerals have been used to identify corresponding circuit features.

DESCRIPTION OF THE PREFERRED EMBODIMENTS

Figure 1:
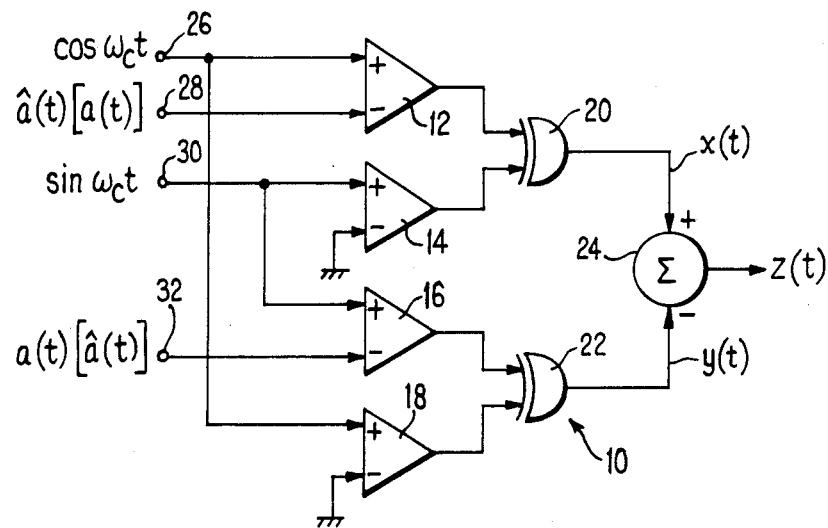
FIG. 1 is a schematic circuit diagram of a Cartesian three level SSB pulse modulator made in accordance with the present invention.

Referring to FIG. 1, the modulator 10 uses Cartesian inputs to give a three level single sideband output z(t). The modulator 10 comprises four comparators 12, 14, 16 and 18. Outputs from the two pairs of comparators 12, 14 and 16, 18 are connected to respective inputs of EXCLUSIVE-OR function circuits or EX-OR gates 20, 22. A summing arrangement 24 has a non-inverting input connected to receive output x(t) from the EX-OR gate 20 and an inverting input connected to receive output y(t) from the EX-OR gate 22.

The modulator 10 has four signal inputs 26, 28 and 30 and 32. The input 26 is connected to the non-inverting inputs of the comparators 12 and 18, the input 28 is connected to the inverting input of the comparator 12, the input 30 is connected to the non-inverting inputs of the comparators 14 and 16 and the input 32 is connected to the inverting input of the comparator 16. Inverting inputs of the comparators 14 and 18 are connected to a reference voltage point, for example earth. Quadrature components $\cos \omega_c t$ and $\sin \omega_c t$ of the carrier signal are applied respectively to the inputs 26 and 30. A modulating signal a(t) and the Hilbert transform of this signal â(t) are in one arrangement applied respectively to the inputs 32, 28, or in the alternative arrangement shown in square brackets, respectively to the inputs 28, 32.

Assuming the first arrangement of the inputs 28, 32 and a single tone input with a frequency $2\pi\omega_m$, then $$x(t) = \text{Sign} [\sin \omega_c t(\cos \omega_c t - \cos \omega_m t)]$$

and $$y(t) = \text{Sign} [\cos \omega_c t(\sin \omega_c t - \sin \omega_m t)],$$

both x(t) and y(t) being double sideband signals with modulation. The fundamental of the output $z(t) = x(t) - y(t)$ is the wanted signal and the upper signal sideband $z^1(t)$ can be derived as follows $$x^1(t) = \sin \omega_c t \cos \omega_c t - \sin \omega_c t \cos \omega_m t$$

$$y^1(t) = \cos \omega_c t \sin \omega_c t - \cos \omega_c t \sin \omega_m t$$

Therefore $z^1(t) = -[\sin (\omega_c t + \omega_m t)]$.

In practice the output will include harmonics of the carrier frequency which can be removed by filtering. More particularly the strong, odd numbered even harmonics and one of the sidebands are attenuated in the summing arrangement 24.

The alternative arrangement with the signal inputs 30 and 32 receiving a(t) and â(t), respectively, enables the lower single sideband to be obtained.

Figure 2:
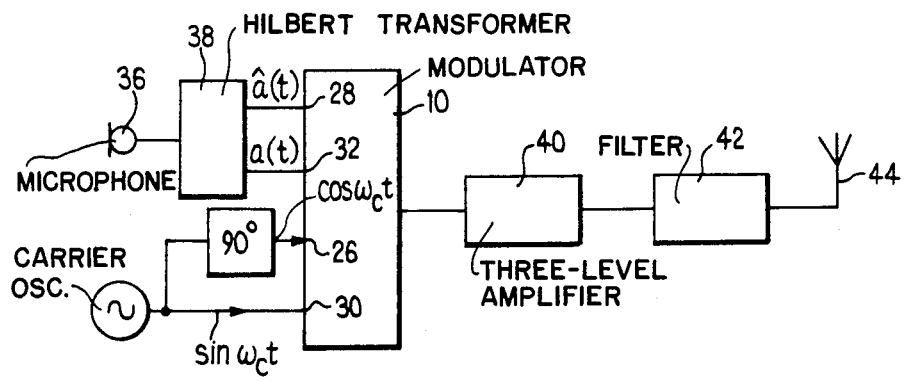
FIG. 2 is a block schematic diagram of a transmitter including the modulator shown in FIG. 1.

FIG. 2 illustrates a transmitter including the modulator illustrated in FIG. 1. A source of modulating signals, for example a microphone 36, is connected to a base band signal processor 38 which includes a wideband 90° phase shifter to produce the Hilbert transform â(t) of the modulating signal a(t). The Hilbert transform â(t) and the signal a(t) are applied to the inputs 28, 32 of the modulator 10. Quadrature components of the carrier signal are applied respectivley to the inputs 26 and 30 of the modulator 10. The three level SSB output z(t) of the modulator 10 is applied to a three level amplifier 40, the output from which is filtered in a filter 42 to remove the harmonics before the SSB signal is applied to the antenna 44.

Figure 3:
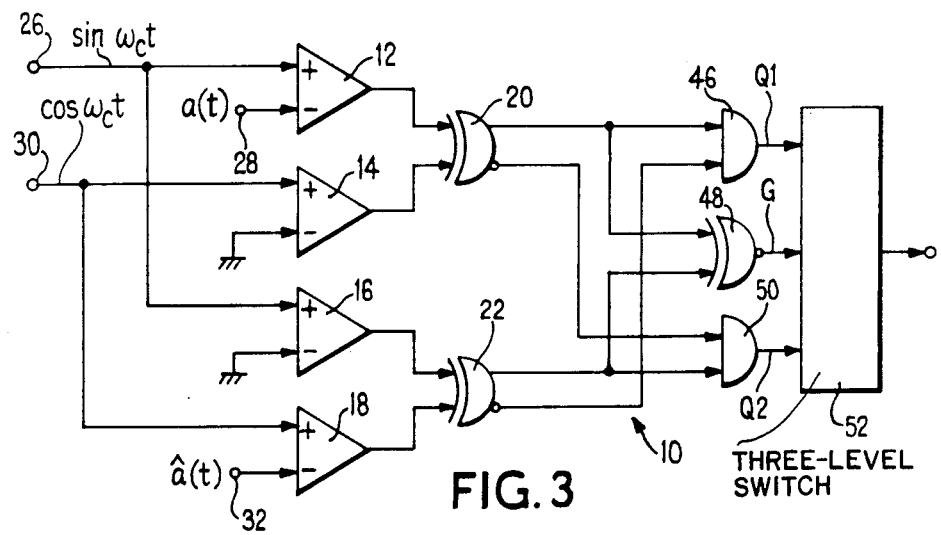
FIG. 3 is a schematic circuit diagram of another SSB pulse modulator made in accordance with the present invention.

FIG. 3 illustrates schematically an embodiment of a modulator 10 which has a high efficiency and cancellation when the outputs of the EX-OR gates 20 and 22 are both high. As in the first described embodiment, the embodiment shown in FIG. 3 has two pairs of comparators 12, 14 and 16, 18, the outputs of each pair being connected to respective inputs of EX-OR gates 20 and 22. Here, however, the signal inputs to the comparators are arranged differently from FIG. 1 in that one quadrature component of the carrier signal, $\sin \omega_c t$, is connected to the non-inverting inputs of the comparators 12 and 16, the other quadrature component of the carrier signal, $\cos \omega_c t$, is connected to the non-inverting inputs of the comparators 14 and 18, the modulating signal a(t) and the Hilbert transform of it, â(t), are applied respectively to inverting inputs of the comparators 12 and 18, and the inverting inputs of the comparators 14 and 16 are connected to a reference voltage point (earth).

In order to obtain cancellation when both the outputs of the EX-OR gates 20, 22 are high, the output of the gate 20 is coupled to an AND gate 46 and an EX-OR gate 48. Similarly the output of the gate 22 is coupled to another AND gate 50 and the EX-OR gate 48. Inverted outputs of the EX-OR gates 20 and 22 are connected to the gates 50 and 46, respectively. The outputs of the gates 46, 48 and 50 namely Q1, G and Q2 are applied to a three level push-pull switch 52 from the output of which a 3-level SSB signal is obtained.

Figure 4:
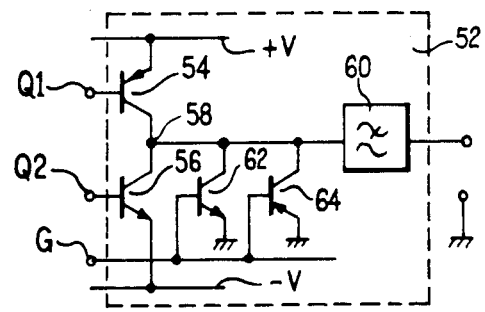
FIG. 4 is a circuit diagram of a three level push-pull switch used in the modulator shown in FIG. 3.

An example of a three level push-pull switch 52 is illustrated in greater detail in FIG. 4. The switch 52 comprises a PNP transistor 54 and a NPN transistor 56 whose emitter-collector paths are connected in series between positive and negative supply rails +V and −V, respectively. A junction 58 of the two collector circuits is connected via a filter 60 to an output terminal. Signals Q1 and Q2 are applied respectively to the base terminals of the transistors 54, 56. The signal G is applied to the base terminals of NPN and PNP transistors 62, 64, respectively, whose emitter-collector circuits are connected in parallel between the junction 58 and a reference voltage line, for example, earth. In operation when the output of one or other EX-OR gate 20, 22 is high and the other is low then one of the AND gates will be enabled and the EX-OR gate 48 will be conductive. In consequence a high output will be produced by the switch 52. When both EX-OR gate outputs are high, then Q1, Q2 and G will be low and no output is produced by the switch 52. Consequently at no time can both the transistors 54 and 56 be conductive and cause a current to flow from one supply rail to the other supply rail.

Figure 5:
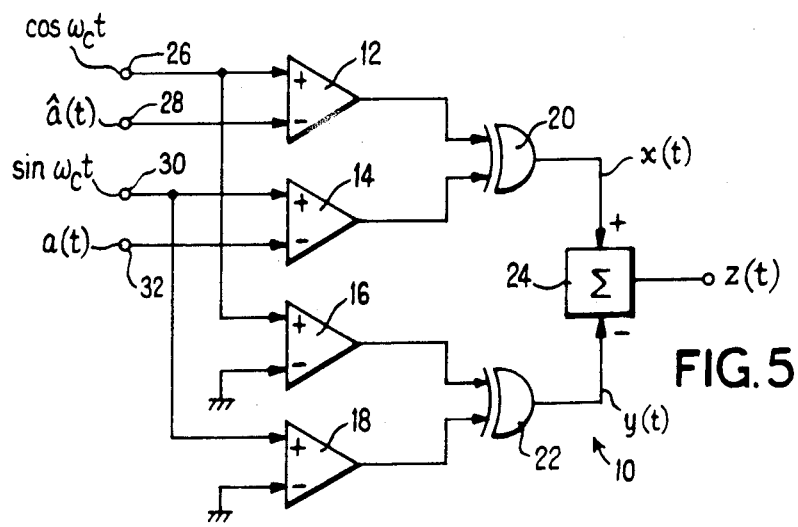
FIG. 5 is a schematic circuit diagram of a further SSB pulse modulator made in accordance with the present invention and FIGS. 6A and 6B are exemplary output waveforms for modulation depths of 1 and 0.1, respectively.

FIG. 5 illustrates a further embodiment of a modulator made in accordance with the present invention. Apart from the particular connections to each of the comparators 12, 14, 16 and 18, the modulator is generally similar to that described with reference to FIG. 1 although x(t) and y(t) will be 2 level SSB signals due to the different arrangement of signal inputs. It can be shown that the output from the summing arrangement 24 includes the single sideband term $\sin(\omega_c t + \omega_m t)$.

Figure 6A:
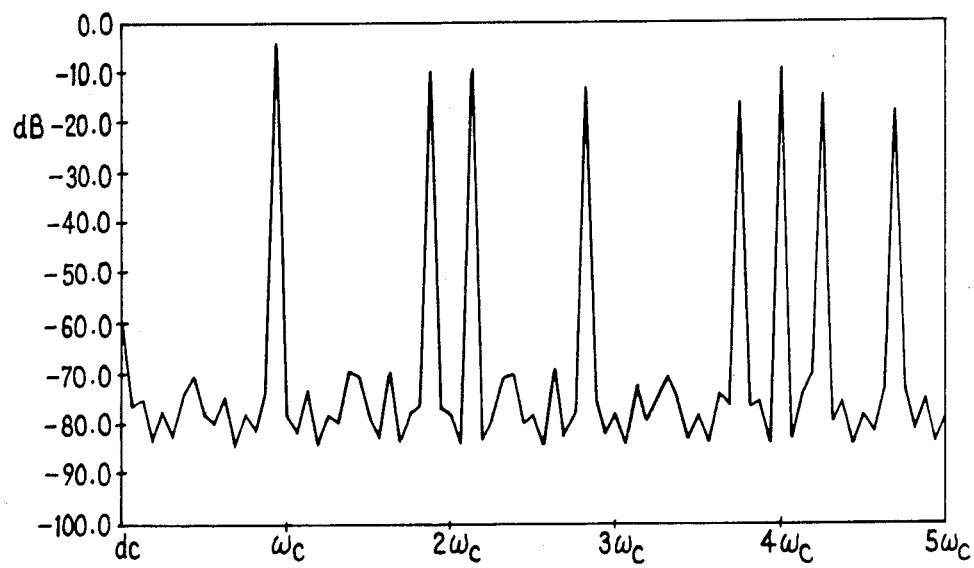
Figure 6B:
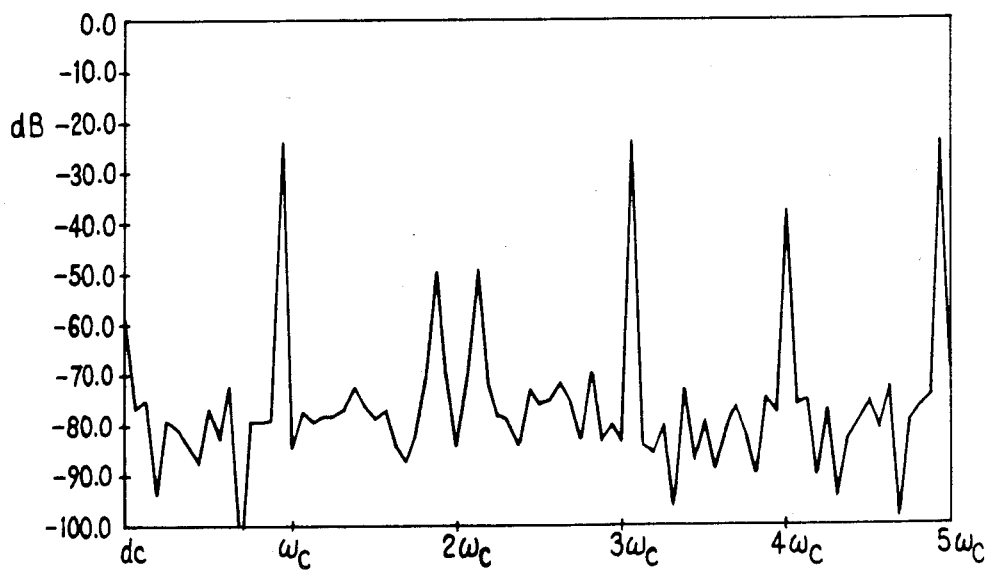

Referring to FIG. 6A, the waveform diagram shows that for a modulation depth of 1, the carrier frequency and the odd and even harmonics are present and have substantially the same amplitude. In contrast FIG. 6B shows that the modulator in accordance with the present invention produces an output waveform for a modulation depth of 0.1 in which the even harmonics, particularly the second harmonic, are much reduced with respect to the wanted signal. The odd harmonics, which are input dependant, are still present and do not die away rapidly but there are no unwanted signals at a higher level than the wanted signals as occurs with the known SSB pulse modulator.

In implementing the illustrated circuits standard ECL logic circuit gates and comparators may be used, for example the comparators may be Plessey H.S. Comparators SP9687. The signal delays in the different signal paths should be carefully matched because any differential delay will be seen for example as a phase error at the input of the push-pull switch 52 (FIG. 3) giving rise to the generation of the unwanted sideband. The matching of the delays is facilitated if the comparators 12 to 18 are constituted by a quad fast comparator and the logic gates are chosen to be in the same integrated circuit package or if the entire circuit is implemented as a single integrated circuit.

It will be evident that, in all the embodiments described, the two input signals to one or more of the comparators may be transposed. If this is done for just one comparator or for three of the four comparators then the summing arrangement of the relevant embodiment will have to be arranged to add together the output signals of the two EX-OR gates rather than subtract them one from the other. It will also be evident that, alternatively or in addition, in all the embodiments described the signal $\sin w_c t$ may be applied in inverted form to one of the two comparators to which it is supplied, as may the signal $\cos w_c t$. If just one of these signals is so inverted as far as one of the comparators is concerned (without also transposing the two input signals to one or three of the comparators) then the summing arrangement will again have to be arranged to add together the output signals of the two EX-OR gates rather than subtract them one from the other. Transposing, in addition, the two input signals to one or three of the comparators will once again result in the relevant summing arrangement being required to subtract.

I claim:

1. A method of producing an SSB signal comprising applying first and second quadrature-related components of a carrier signal to first and second pairs of comparators, the first component being applied to one comparator of each pair and the second component being applied to the other comparator of each pair, applying a modulating signal and the Hilbert transform thereof respectively to a said comparator to which the first component is applied and to a said comparator to which the second component is applied, multiplying together the outputs of the comparators of each pair and combining the products so obtained to produce an SSB signal in which strong even harmonics of the carrier signal have been attenuated relative to the levels thereof which would have been obtained had only one pair of comparators been employed.

2. An SSB pulse modulator comprising: first and second signal inputs for receiving respective ones of quadrature-related components of a carrier signal, a third signal input for receiving a modulating signal and a fourth signal input for receiving the Hilbert transform of the modulating signal; first and second pairs of comparators, said first signal input being coupled to an input of the first of the comparators of each pair, said second signal input being coupled to an input of the second comparator of each pair, said third signal input being coupled to a further input of a said comparator to which said first signal input is coupled, and said fourth signal input being coupled to a further input of a said comparator to which said second signal input is coupled; a first EXCLUSIVE-OR function circuit having inputs to which the outputs of the comparators of the first pair are coupled; a second EXCLUSIVE-OR function circuit having inputs to which the outputs of the comparators of the second pair are coupled; and a signal combining circuit coupled to outputs of the EXCLUSIVE-OR function circuits for combining the output signals therefrom in such a sense as to produce in operation an SSB output signal in which strong even harmonics of the carrier signal have been attenuated relative to the levels thereof which would have obtained had only one pair comparators been employed.

3. A modulator as claimed in claim 2, wherein the third and fourth inputs are coupled to an input of a comparator of one pair and to an input of a comparator of the other pair, respectively.

4. A modulator as claimed in claim 2, wherein the third and fourth inputs are coupled to an input of one comparator of one pair and to an input of the other comparator of that pair, respectively.

5. A modulator as claimed in claims 2, in which the signal combining circuit comprises a 3-level push-pull switch.

* * * * *